(12) United States Patent  (10) Patent No.: US 7,813,393 B2
Sudo  (45) Date of Patent: Oct. 12, 2010

(54) SEMICONDUCTOR LASER, LIGHT SOURCE DEVICE, LIGHTING DEVICE, PROJECTOR, AND MONITOR DEVICE

(75) Inventor: Kiyoto Sudo, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 149 days.

(21) Appl. No.: 12/170,083

(22) Filed: Jul. 9, 2008

(65) Prior Publication Data

US 2009/0041069 A1 Feb. 12, 2009

(30) Foreign Application Priority Data

Aug. 10, 2007 (JP) ............................. 2007-208997

(51) Int. Cl.
*H01S 3/00* (2006.01)
(52) U.S. Cl. .................. 372/38.07; 372/38.02; 372/23; 372/22; 372/21
(58) Field of Classification Search ............. 372/38.07, 372/38.02, 23, 22, 21
See application file for complete search history.

(56) References Cited

U.S. PATENT DOCUMENTS

| 2004/0160996 A1* | 8/2004 | Giorgi et al. .................. 372/25 |
| 2006/0220213 A1* | 10/2006 | Kondou et al. ............... 257/690 |
| 2007/0121685 A1* | 5/2007 | Maekawa ..................... 372/21 |
| 2008/0102576 A1* | 5/2008 | Suzuki et al. ................ 438/237 |

FOREIGN PATENT DOCUMENTS

JP  A-2006-106130  4/2006

* cited by examiner

*Primary Examiner*—Minsun Harvey
*Assistant Examiner*—Kinam Park
(74) *Attorney, Agent, or Firm*—Oliff & Berridge, PLC

(57) ABSTRACT

A light source device includes a semiconductor laser, and a drive circuit supplying the semiconductor laser with a pulsed drive current, and in the semiconductor laser, a laser emitting element and a free wheel diode are formed on the same substrate, and a cathode of the free wheel diode is connected to a current input terminal of the laser emitting element, and an anode of the free wheel diode is connected to a current output terminal of the laser emitting element.

8 Claims, 5 Drawing Sheets

EQUIVALENT CIRCUIT DIAGRAM

CROSS-SECTIONAL STRUCTURAL DIAGRAM

SEMICONDUCTOR LASER, LIGHT SOURCE DEVICE, LIGHTING DEVICE, PROJECTOR, AND MONITOR DEVICE

BACKGROUND

1. Technical Field

The present invention relates to a semiconductor laser, a light source device using the semiconductor laser, a lighting device using the light source device, a projector, and a monitor device.

2. Related Art

In the past, an ultra high-pressure mercury lamp (UHP) has been commonly used for a projector for projecting an image as a light source thereof. However, the UMP has various problems such that it takes time as long as several minutes before the maximum luminance has been reached, and consequently, instant lighting is difficult, that it has relatively short life, or that the color reproduction range is not sufficiently large. Therefore, in recent years, development of a method of using semiconductor lasers as the light source has been in progress (see e.g., JP-A-2006-106130).

In the semiconductor lasers, by applying drive voltage to a laser diode (a laser emitting element) forming the semiconductor laser so that a drive current having a current value greater than the laser oscillation start current flows, the laser diode starts the laser oscillation, thus emitting the laser beam. It should be note that in view of providing a longer operating life, it is not preferable to apply a direct current drive voltage to the laser diode. Therefore, a pulsed drive voltage is commonly applied to the laser diode to make a pulsed drive current flow therethrough, thus making it operate to emit a laser beam. Hereinafter this operation is referred to as "pulse drive."

However, there is a problem that when the pulse drive is executed on the laser diode, a flyback voltage with opposite polarity to the drive voltage should be applied to the laser diode by the stray inductance existing owing to the mounting of the circuit composing the light source device, resulting in the degradation of the operation efficiency of the circuit for driving the laser diode.

SUMMARY

Various embodiments provide a technology capable of preventing the degradation of the operation efficiency caused by the stray inductance existing owing to the mounting of the circuit composing the light source device in the light source device using semiconductor lasers.

A light source device in one embodiment includes a semiconductor laser, and a drive circuit supplying the semiconductor laser with a pulsed drive current, in the semiconductor laser, a laser emitting element and a free wheel diode are formed on the same substrate, and a cathode of the free wheel diode is connected to a current input terminal of the laser emitting element, and an anode of the free wheel diode is connected to a current output terminal of the laser emitting element.

In the light source device in one embodiment, since the free wheel diode is provided on the same semiconductor substrate as the laser emitting element of the semiconductor laser, it becomes possible to suppress the loss in the laser emitting element caused by the stray inductance existing owing to mounting of the circuit composing the light source device, thereby preventing the degradation in the operation efficiency of the circuit driving the laser emitting element.

In the light source device according to one embodiment, there is further provided a wavelength conversion element converting a wavelength of a laser beam emitted from the semiconductor laser into a predetermined wavelength.

According to one embodiment, the laser beam with the wavelength different from the wavelength of the original laser beam can easily be emitted.

In the light source device according to one embodiment, the laser emitting element of the semiconductor laser is emitting a red laser beam.

According to one embodiment, since the laser emitting element emitting the red laser beam can be formed with relative ease, by using the laser emitting element emitting the red laser beam as the laser emitting element of the semiconductor laser, the laser beam with the wavelength in the visible range can easily be emitted.

In the light source device according to one embodiment, the wavelength conversion element is an element converting the wavelength of the red laser beam into a wavelength corresponding to one of red, green, and blue.

A semiconductor laser in one embodiment includes a laser emitting element formed on a semiconductor substrate, and a free wheel diode formed on the semiconductor substrate on which the laser diode is formed, a cathode of the free wheel diode is connected to a current input terminal of the laser emitting element, and an anode of the free wheel diode is connected to a current output terminal of the laser emitting element.

By configuring the light source device using the semiconductor laser according to one embodiment, the same function and result as in one embodiment described above.

A lighting device includes the light source device according to one embodiment, and a diffusion element diffusing the light beam emitted from the light source device.

According to one embodiment, the high-power lighting can be performed.

A projector includes the light source device according to one embodiment, and a projection section projecting a light beam modulated in accordance with the image signal.

According to one embodiment, a high-brightness image can be projected.

A monitor device includes the light source device according to one embodiment, a diffusion element diffusing the light beam emitted from the light source device, and an image pick-up section shooting an object lighted by the diffusion element.

According to one embodiment, since the object can be lighted brightly with the high-power laser source, it becomes possible to shoot a clear image.

BRIEF DESCRIPTION OF THE DRAWINGS

The invention will now be described with reference to the accompanying drawings, wherein like numbers reference like elements.

DESCRIPTION OF EXEMPLARY EMBODIMENTS

Some embodiments of the invention will hereinafter be explained.

Figure 1:
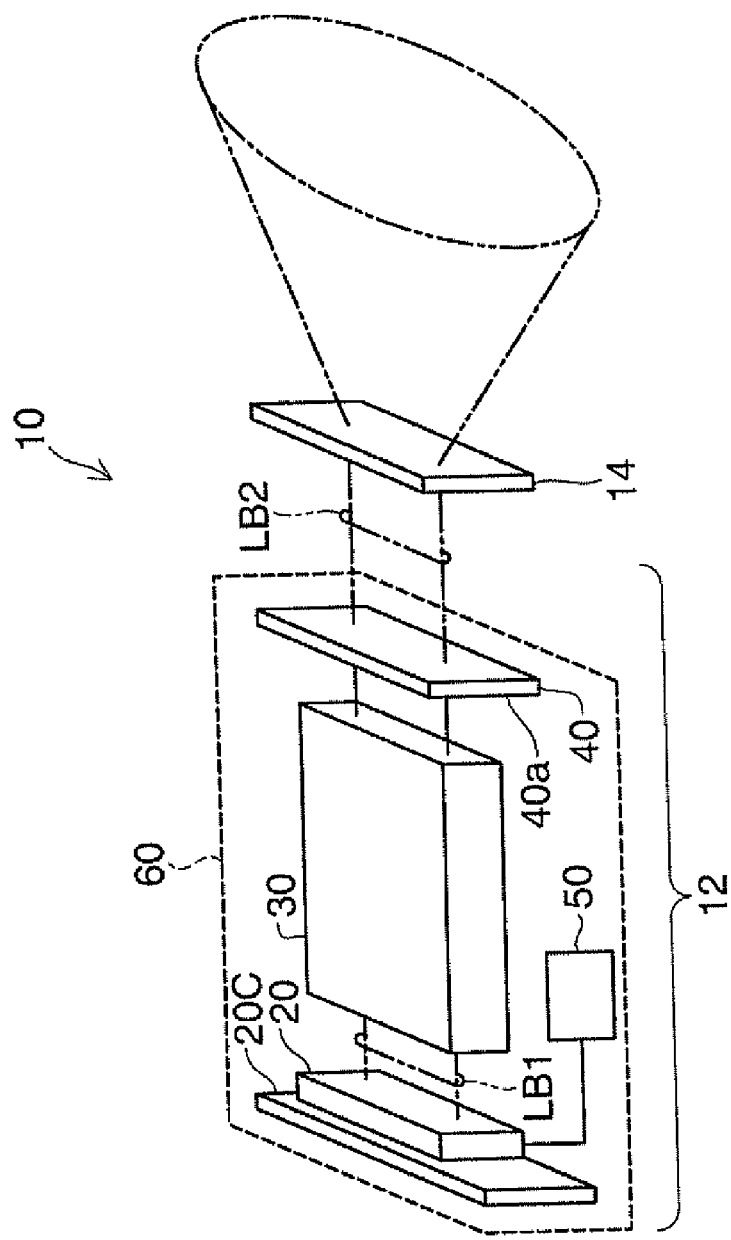
FIG. 1 is a schematic configuration diagram of a lighting device 10 as a first embodiment of the invention.

FIG. 1 is a schematic configuration diagram of a lighting device 10 as a first embodiment of the invention. The lighting device 10 is provided with a laser source device 12 and a diffusion element 14 for diffusing the laser beam emitted from the laser source device 12.

The laser source device 12 is composed of a semiconductor laser 20 mounted on a mount 20C, a wavelength conversion element 30, and a reflecting mirror 40 disposed inside a package 60.

As the diffusion element 14, for example, a diffusion lens, or a hologram element having an interference pattern previously formed so as to diffuse the incident light can be used.

The semiconductor laser 20 is driven by the drive circuit 50 supplying a pulsed drive current thereto, and emits an infrared laser beam. It should be noted that the semiconductor laser 20 will further be described later.

The wavelength conversion element 30 is an element for causing a phenomenon of second harmonic generation (SHG), namely a second-order nonlinear optical phenomenon of converting two photons into one photon with a frequency double as high as that of the original photons, and is obtained by providing a polarization inversion structure to a ferroelectric material. The wavelength conversion element 30 introduces the laser beam LB1 emitted from the semiconductor laser 20 to the inside thereof, and converts the wavelength thereof to generate a visible laser beam LB2 with a color such as blue, green, or red.

The polarization inversion structure inside the wavelength conversion element 30 is formed by an electric field application method in an element using lithium niobate or lithium tantalate. It should be noted that the method of forming the polarization inversion structure is not necessarily limited to this method, but other methods such as a polarization inversion method by ion exchange or a micro-domain inversion method with an electron beam can also be used therefor. Regarding the material, it is not necessarily limited to lithium niobate and lithium tantalate, a configuration using an appropriate material for each of the methods can be adopted.

The reflecting mirror 40 has a surface 40a provided with a special coating facing the wavelength conversion element 30. This special coating is highly reflective to the excitation light emitted from the semiconductor laser 20, and is highly transmissive to the second harmonic wave emitted from the wavelength conversion element 30. According to this configuration, the second harmonic wave emitted from the wavelength conversion element 30 is transmitted through the reflecting mirror 40, and enters the diffusion element 14 as the laser beam LB2 wavelength-converted into the visible beam.

Figure 2A:
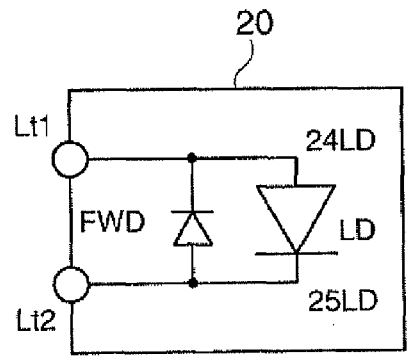
FIGS. 2A and 2B are explanatory diagrams showing an inside configuration of a semiconductor laser 20.
Figure 2B:
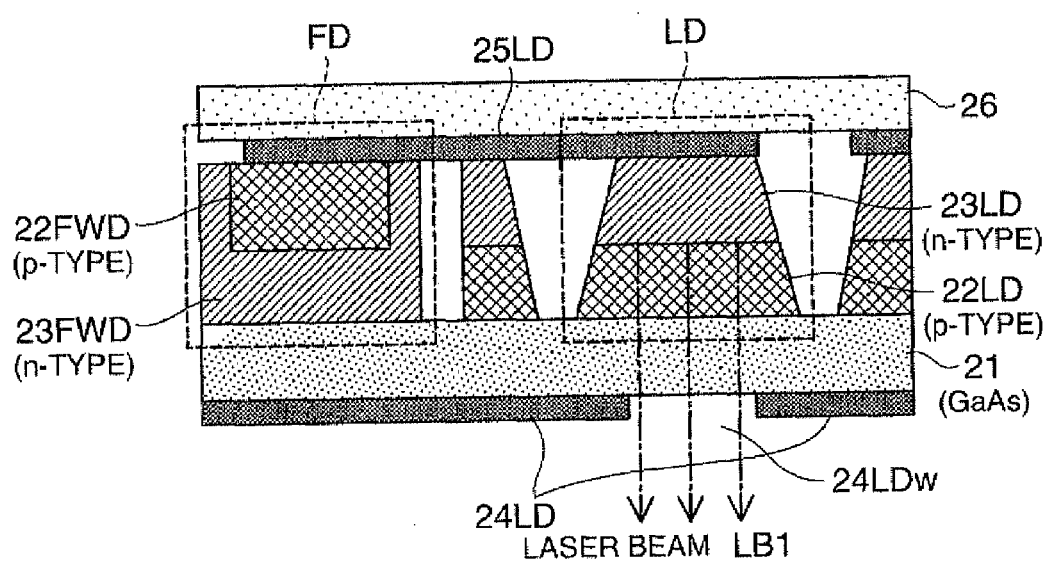

FIGS. 2A and 2B are explanatory diagrams showing the inside structure of the semiconductor laser 20, wherein FIG. 2A shows an equivalent circuit diagram, and FIG. 2B shows a schematic cross-sectional structural diagram.

As shown in the equivalent circuit diagram of FIG. 2A, the semiconductor laser 20 is composed of a laser diode LD as a laser emitting element and a free wheel diode FWD, and as shown in the schematic cross-sectional structural diagram of FIG. 2B, the laser diode LD and the free wheel diode FWD are formed on the same substrate (a semiconductor substrate) 21 composed of GaAs.

The laser diode LD is composed by forming the p-type domain 22LD and the n-type domain 23LD sequentially on the substrate 21, and is called a vertical-cavity surface-emitting laser (VCSEL), which emits the laser beam in a direction perpendicular to the substrate 21. The p-type domain 22LD of the laser diode LD is connected to a p-side electrode 24LD via the substrate 21, the p-side electrode 24LD is connected to a first semiconductor laser connection terminal Lt1. Further, the n-type domain 23LD of the diode LD is connected to the n-side electrode 25LD, and the n-side electrode 25LD is connected to a second semiconductor laser connection terminal Lt2. The p-side electrode 24LD corresponds to a current input terminal of the laser emitting element, and the n-side electrode 25LD corresponds to a current output terminal of the laser emitting element. It should be noted that the p-side electrode 24LD is provided with an emission window 24LDw for emitting the laser beam. Further, on the n-side electrode 25LD, there is formed a sub-mount 26 as a relaxation member for absorbing the thermal expansion of the mount 20C in order for attaching the semiconductor laser 20 to the mount 20C made of metal. As the sub-mount 26, beryllium oxide, for example, is used.

The free wheel diode FWD is a diode configured by forming the n-type domain (cathode) 23FWD and the p-type domain (anode) 22FWD on the substrate 21.

The n-type domain 23FWD of the free wheel diode FWD is connected to the p-type domain 22LD of the laser diode LD via the substrate 21 and the p-side electrode 24LD of the laser diode LD, and the p-type domain 22FWD of the free wheel diode FWD is connected to the n-side electrode 25LD of the laser diode LD. In other words, the free wheel diode FWD is connected in parallel to the laser diode LD so as to have the opposite direction of the p-n junction to the direction of the p-n junction of the laser diode LD.

In the semiconductor laser 20 described hereinabove, a pulsed drive voltage is applied between the first semiconductor laser connection terminal Lt1 and the second semiconductor laser connection terminal Lt2 to make the pulsed drive current flow from the first semiconductor laser connection terminal Lt1 to the second semiconductor laser connection terminal Lt2, thereby driving the laser diode LD, thus emitting the laser beam from the laser diode LD.

As described above, the semiconductor laser 20 has a feature of having the free wheel diode FWD, which is connected in parallel to the laser diode LD so as to have the opposite direction of the p-n junction to the direction of the p-n junction of the laser diode LD, on the same substrate, thus the advantages described below can be obtained.

Figure 3:
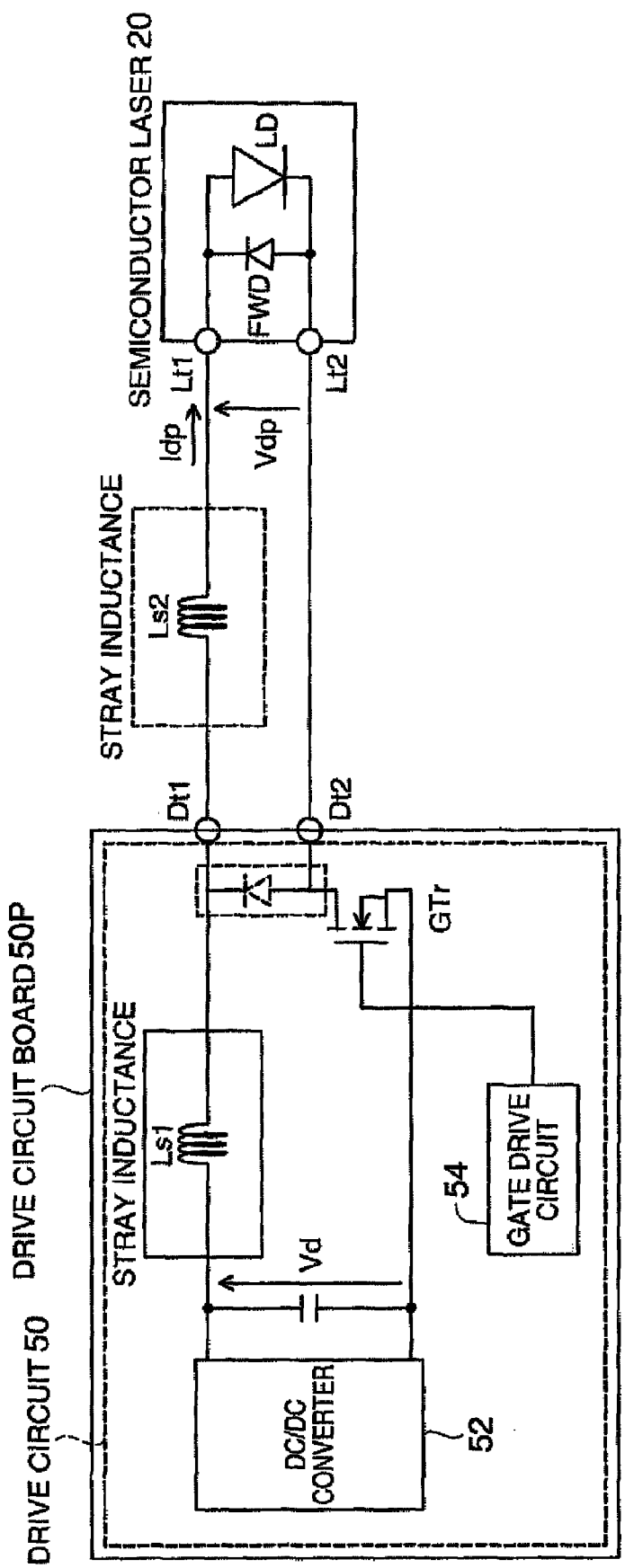
FIG. 3 is an explanatory diagram showing an advantage of the first embodiment.

FIG. 3 is an explanatory diagram showing the advantages of the present embodiment, and specifically, an explanatory diagram showing the condition in which a drive circuit board 50P having the drive circuit 50 of the semiconductor laser 20 mounted thereon is connected to the semiconductor laser 20.

As shown in FIG. 3, the first semiconductor laser connection terminal Lt1 and the second semiconductor laser connection terminal Lt2 of the semiconductor laser 20 are connected to two drive circuit connection terminals Dt1, Dt2 on the drive circuit board 50P, thereby being connected to the drive circuit 50 mounted on the drive circuit board 50P.

The laser diode LD forming the semiconductor laser 20 starts the laser oscillation to emit the laser beam in accordance with the drive voltage Vd generated by a DC/DC converter 52 and applied between the first semiconductor laser connection terminal Lt1 and the second semiconductor laser connection terminal Lt2 of the semiconductor laser 20 so that the drive current having the current value greater than the laser oscillation start current flows from the drive circuit 50. However, in view of providing the laser diode LD with a longer operating life, it is not preferable to apply a direct current drive voltage Vd to the laser diode LD. Therefore, in the drive circuit 50, a gate drive circuit 54 applies a pulsed gate voltage to a gate transistor GTr, thereby repeatedly switching ON and OFF the gate transistor GTr to apply a pulsed drive voltage Vdp to between the first semiconductor laser connection terminal Lt1 and the second semiconductor laser connection terminal Lt2 of the semiconductor laser 20, thereby applying a pulsed drive current Idp to the laser diode LD of the semiconductor laser 20 to drive the semiconductor laser 20.

It should be noted here that as shown in the drawing, on the drive circuit board SOP on which the drive circuit 50 is mounted, a so-called stray inductance Ls1 is provided to the mounting wiring from the DC/DC converter 52 to the drive circuit connection terminal Dt1. Further, as shown in the drawing, the stray inductance Ls2 is provided also to the connection wiring connecting the drive circuit connection terminal Dt1 and the first semiconductor laser connection terminal Lt1 of the semiconductor laser 20 to each other.

Since these stray inductances Ls1, Ls2 generate the flyback voltage with opposite polarity to the drive voltage Vdp applied while the gate transistor GTr is in the ON state when the gate transistor GTr is switched from ON to OFF, the flyback voltage is inevitably applied between the first semiconductor laser connection terminal Lt1 and the second semiconductor laser connection terminal Lt2 of the semiconductor laser 20.

If the free wheel diode FWD provided inside the semiconductor laser 20 were eliminated, there is a problem that the flyback voltage caused by the stray inductances Ls1, Ls2 is applied to the laser diode LD to increase the loss in the laser diode LD caused by the flyback voltage, resulting in degradation in the operation efficiency of the laser diode LD.

On the contrary, since the semiconductor layer 20 has the free wheel diode FWD, which is connected in parallel to the laser diode LD so as to have the opposite direction of the p-n junction to the direction of the p-n junction of the laser diode LD, on the same substrate, even if the flyback voltage is caused by the stray inductances of the connection wiring as described above, it can be limited so that the voltage higher than the forward voltage of the free wheel diode FWD is not applied to the laser diode LD.

Here, it is possible that, for example, the free wheel diode is mounted on the drive circuit board 50P (illustrated with dotted lines in the drive circuit board 50P shown in FIG. 3). However, in this case, although it is possible to limit the flyback voltage caused by the stray inductance Ls1 formed by the connection wiring on the drive circuit board 50P, limitation of the flyback voltage caused by the stray inductance Ls2 formed by the connection wiring between the drive circuit board 50P and the semiconductor laser 20 is not achievable. On the contrary, since the semiconductor laser 20 has the free wheel diode on the same substrate as the substrate the laser diode LD is mounted on, although small wiring for connecting the laser diode LD and the free wheel diode FWD to each other is required, the stray inductance caused by the small wiring is significantly small in comparison with that caused by the external connection wiring, and consequently, effective limitation of the flyback voltage can be achieved.

As described above, since the semiconductor laser 20 can effectively limit the flyback voltage caused by the stray inductance, it is possible to suppress the loss in the laser diode LD caused by the flyback voltage to prevent degradation of operation efficiency of the laser diode LD. Therefore, the laser source device 12 using the semiconductor laser 20 and the lighting device 10 using the laser source device 12 can emit a high-power laser beam.

Figure 4:
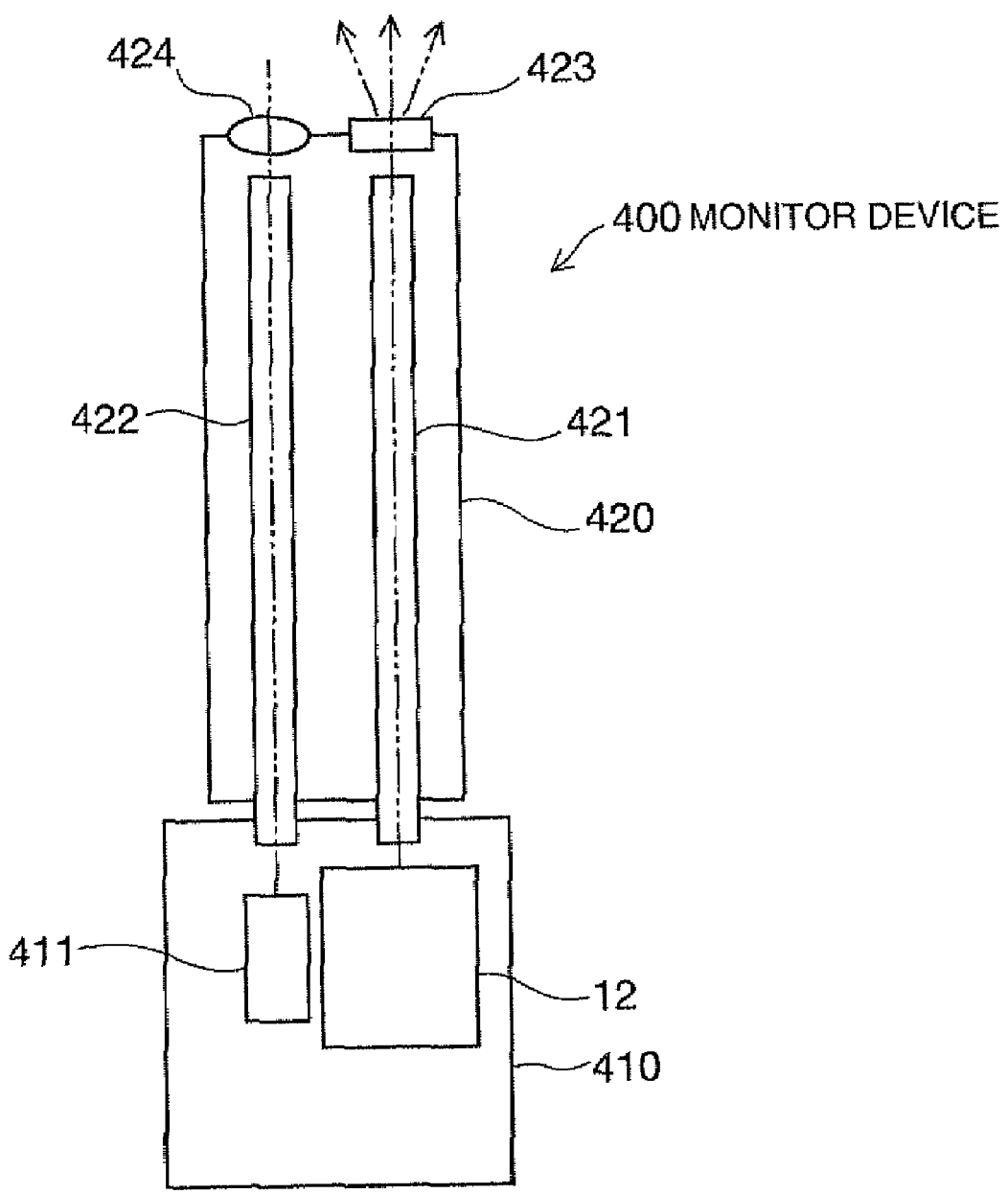
FIG. 4 is a schematic configuration diagram of a monitor device 400 as a second embodiment of the invention.

FIG. 4 is a schematic configuration diagram of a monitor device 400 as a second embodiment of the invention. The monitor device 400 is provided with a device main body 410 and an optical transmission section 420. The device main body 410 is provided with the laser source device 12 of the first embodiment described above.

The optical transmission section 420 is provided with two light guides 421, 422 of a light transmission side and a light reception side, respectively. Each of the light guides 421, 422 is a bundle of a number of optical fibers, and is capable of transmitting a laser beam over a long distance. On the entrance side of the light guide 421 of the light transmission side, there is disposed the laser source device 12, while on the emission side thereof there is disposed a diffusion plate 423. The laser beam emitted from the laser source device 12 is transmitted to the diffusion plate 423 disposed on the tip of the light transmission section 420 through the light guide 421, and is diffused by the diffusion plate 423 to irradiate an object.

On the tip of the light transmission section 420, there is also provided an imaging lens 424, and the reflected light beam from the subject can be received by the imaging lens 424. The reflected light beam thus received is transmitted through the light guide 422 of the light reception side to a camera 411 as an image pickup section disposed inside the device main body 410. As a result, the reflected light obtained by irradiating the object with the laser beam emitted from the laser source device 12 can be imaged by the camera 411.

According to the monitor device 400 configured as described above, since the subject can be irradiated by the high-power laser source device 12, the image can clearly be shot by the camera 411.

Figure 5:
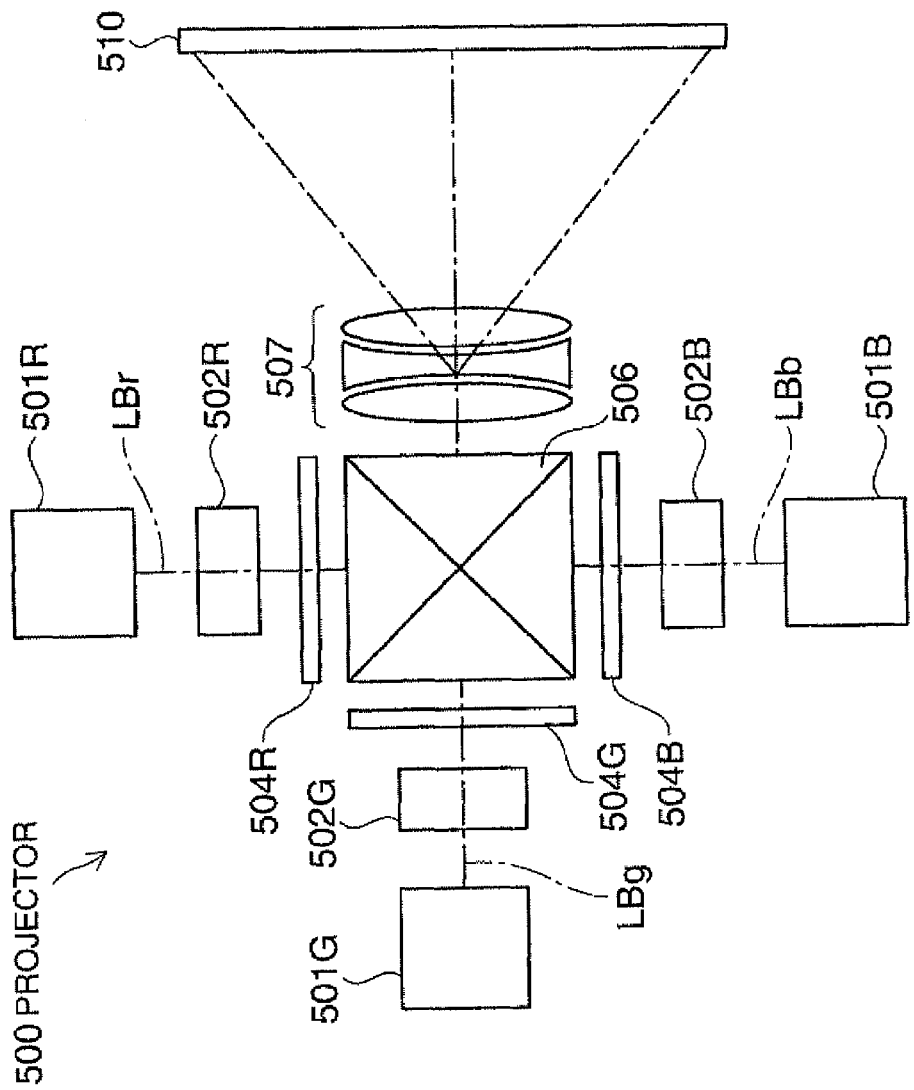
FIG. 5 is a schematic configuration diagram of a projector 500 as a third embodiment of the invention.

FIG. 5 is a schematic configuration diagram of a projector 500 as a third embodiment of the invention. In the drawing, a chassis forming a projector 500 is omitted for the sake of simplification. The projector 500 is provided with a red laser source device 501R for emitting a red light beam, a green laser source device 501G for emitting a green light beam, and a blue laser source device 501B for emitting a blue light beam.

The laser source devices 501R, 501G, and 501B for respective colors have the same configuration as that of the laser source device 12 of the first embodiment described above except the point of emitting the laser beams LBr, LBg, and LBb of the respective colors.

Further, the projector 500 is provided with liquid crystal panels (liquid crystal light valves) 504R, 504G, 504B as light modulation elements for respectively modulating the laser beams LBr, LBg, LBb of the respective colors emitted from the laser source devices 501R, 501G, 501B of the respective colors in accordance with an image signal transmitted from a personal computer or the like, a cross dichroic prism 506 for combining the light beams emitted from the liquid crystal light valves 504R, 504G, 504B to guide the combined light beam to a projection lens 507, and the projection lens 507 for projecting the image formed by the liquid crystal light valves 504R, 504G, 504B enlargedly on a screen 510.

Further, in order for equalizing the illumination distribution of the laser beams emitted from the laser sources 501R, 501G, 501B, the projector 500 is provided with integrator optical systems 502R, 502G, 502B disposed downstream of the laser sources 501R, 501G, 501B along the optical paths, respectively, and illuminates the liquid crystal light valves 504R, 504G, 504B with the light beams having the illumination distribution equalized by the integrator optical systems 502R, 502G, 502B. For example, the integrator optical systems 502R, 502G, 502B are configured using optical elements such as a rod lens, lens array, or hologram element.

The three colored light beams modulated by the respective liquid crystal light valves 504R, 504G, and 504B then enter the cross dichroic prism 506. The prism is formed by bonding four rectangular prisms, and is provided with a dielectric multilayer film for reflecting red light beam and a dielectric multilayer film for reflecting blue light beam disposed on the inside surfaces forming a crisscross. The three colored light beams are combined by these dielectric multilayer films to form a light beam for representing a color image. Further, the light beam obtained by combining the three colored light beams is projected on the screen 510 by the projection lens 507, thus an enlarged image is displayed.

According to the projector 500 configured as described above, since the high-power laser source devices 501R, 501G, 501B can be used, a high-brightness image can be displayed.

It should be noted that in the constituents of the embodiments described above, the elements other than the elements recited in the appended independent claims are additional elements, and can arbitrarily be eliminated. Further, the invention is not limited to the embodiments described above, but can be put into practice in various forms within the scope or the spirit of the invention, and the following modifications, for example, are also possible.

Although in the embodiments described above, the explanation is presented exemplifying the case in which the VCSEL type laser diode is provided as the laser emitting element, it is also possible to adopt the configuration of using an edge-emitting type laser diode having the resonance direction of the light beam parallel to the surface of the substrate instead thereof.

Further, although in the embodiments described above, the explanation is presented exemplifying the case in which only one laser diode is used as the laser emitting element, what is provided with a plurality of laser diodes as an array can also be adopted. In this case, the free wheel diode can be provided to each laser diode one-to-one. Further, it is also possible that one free wheel diode is provided to all of the plurality of laser diodes, or that the plurality of laser diodes is divided into two or more groups, and each of the groups is provided with one free wheel diode.

Although in the light source device of the embodiments described above, explanation is presented exemplifying the case in which the external resonance type is used as the resonance structure of the semiconductor laser, it can be applied to the internal resonance type as well.

Although the projector 500 of the third embodiment is a so-called three-LCD projector using the liquid crystal panels as the light modulation elements, a single-LCD projector having a configuration capable of achieving the color display with a single liquid crystal panel by lighting the laser source device in a time-sharing manner for every color can also be adopted instead thereof. Further, a scan type projector, which displays an image by scanning the laser beam modulated in accordance with an image signal, can also be adopted. It should be noted that the projector using digital micromirror devices (DMD, trademark of the Texas Instruments) as the light modulation element instead of the liquid crystal light valve can also be provided.

The entire disclosure of Japanese Patent Application No. 2007-208997, filed Aug. 10, 2007 is expressly incorporated by reference herein.

What is claimed is:

1. A light source device comprising:
a semiconductor laser; and
a drive circuit supplying the semiconductor laser with a pulsed drive current,
wherein in the semiconductor laser,
a laser emitting element and a free wheel diode are formed on a same substrate, and
a cathode of the free wheel diode is connected to a current input terminal of the laser emitting element by a first terminal, and an anode of the free wheel diode is connected to a current output terminal of the laser emitting element by a second terminal,
the substrate is provided between 1) the cathode of the free wheel diode and the current input terminal of the laser emitting element, and 2) the first terminal, and
the first terminal includes a hole for emitting a laser beam from the laser emitting element.

2. The light source device according to claim 1 further comprising:
a wavelength conversion element converting a wavelength of a laser beam emitted from the semiconductor laser into a predetermined wavelength.

3. The light source device according to claim 2,
wherein the laser emitting element of the semiconductor laser is emitting a red laser beam.

4. The light source device according to claim 3,
wherein the wavelength conversion element is an element converting the wavelength of the red laser beam into a wavelength corresponding to one of red, green, and blue.

5. A semiconductor laser comprising:
a laser emitting element formed on a semiconductor substrate; and
a free wheel diode formed on the semiconductor substrate on which the laser diode is formed,
wherein a cathode of the free wheel diode is connected to a current input terminal of the laser emitting element by a first terminal, and an anode of the free wheel diode is connected to a current output terminal of the laser emitting element by a second terminal,
the substrate is provided between 1) the cathode of the free wheel diode and the current input terminal of the laser emitting element, and 2) the first terminal, and
the first terminal includes a hole for emitting a laser beam from the laser emitting element.

6. A lighting device comprising:
the light source device according to claim 1; and
a diffusion element diffusing the light beam emitted from the light source device.

7. A projector comprising:
the light source device according to claim 1; and
a projection section projecting a light beam modulated in accordance with the image signal.

8. A monitor device comprising:
the light source device according to claim 1; a diffusion element diffusing the light beam emitted from the light source device; and
an image pick-up section shooting an object lighted by the diffusion element.

* * * * *